(12) United States Patent
Fang et al.

(10) Patent No.: US 7,417,254 B2
(45) Date of Patent: Aug. 26, 2008

(54) SWITCHING DEVICE FOR A PIXEL ELECTRODE AND METHODS FOR FABRICATING THE SAME

(75) Inventors: Kuo-Lung Fang, Jhudong Township, Hsinchu County (TW); Wen-Ching Tsai, Wujie Township, Yilan County (TW); Han-Tu Lin, Wuci Township, Taichung County (TW)

(73) Assignee: AU Optronics Corp., Hsinchu (TW)

( * ) Notice: Subject to any disclaimer, the term of this patent is extended or adjusted under 35 U.S.C. 154(b) by 294 days.

(21) Appl. No.: 11/341,822

(22) Filed: Jan. 27, 2006

(65) Prior Publication Data

US 2006/0160284 A1    Jul. 20, 2006

(30) Foreign Application Priority Data

Jul. 13, 2005    (TW)    ............................... 94123698 A

(51) Int. Cl.
*H01L 29/04* (2006.01)
*H01L 21/00* (2006.01)

(52) U.S. Cl. .............................. 257/72; 438/29; 438/34; 438/151; 257/290

(58) Field of Classification Search .................. 438/29, 438/34, 73, 30, 149, 151, 155, 164; 257/59, 257/66, 72, 290, 291, 347, 444
See application file for complete search history.

(56) References Cited

U.S. PATENT DOCUMENTS

| 7,030,012 | B2* | 4/2006 | Divakaruni et al. | .......... 438/652 |
| 7,309,895 | B2* | 12/2007 | Hoffman et al. | ............ 257/347 |
| 2003/0134505 | A1* | 7/2003 | Dalton et al. | ............... 438/637 |
| 2004/0185668 | A1 | 9/2004 | Morita et al. | |
| 2005/0148143 | A1 | 7/2005 | Yang et al. | |
| 2006/0139342 | A1* | 6/2006 | Yu | .............................. 345/204 |

OTHER PUBLICATIONS

CN Office Action mailed Apr. 13, 2007.

* cited by examiner

*Primary Examiner*—Kevin M Picardat
(74) *Attorney, Agent, or Firm*—Thomas, Kayde, Horstemeyer & Risley

(57) ABSTRACT

The invention discloses a switching devise for a pixel electrode of display devise and methods for fabricating the same. A gate is formed on a portion of a substrate. A semiconductor layer is formed on the gate. A source and a drain are formed on a portion of the semiconductor layer. A low-k (low dielectric constant) materia layer, such as a layer of a-SiC:H or a-SiCN:H, is formed between the gate and the semiconductor layer and/or on the source/drain.

18 Claims, 4 Drawing Sheets

SWITCHING DEVICE FOR A PIXEL ELECTRODE AND METHODS FOR FABRICATING THE SAME

BACKGROUND

The invention relates to a display device, and more particularly to a switching device for a pixel electrode and methods for fabricating the same.

Bottom-gate type thin film transistors (TFTs) are widely used for thin film transistor liquid crystal displays (TFT-LCDs). FIG. 1 is a sectional view of a conventional bottom-gate type TFT structure 100. The TFT structure 100 typically comprises a glass substrate 110, a gate 120, a gate-insulating layer 130, a channel layer 140, an ohmic contact layer 150, a source 160 and a drain 170.

In a conventional TFT structure for an LCD, $SiN_x$ is employed as a cap-dielectric layer. However, serious RC delay is likely to occur due to its high k value of about 7. Specifically, RC delay becomes worse as $SiN_x$ is applied to an electrical circuit in large-size TFT-LCDs.

SUMMARY

Thin film transistors and fabrication methods thereof are provided. Problems such as RC delay are ameliorated and no additional processes, such as photolithography, are required.

A first embodiment of the invention comprises the following steps. A metal layer is formed on a substrate, for example, by chemical vapor deposition (CVD), electrochemical plating (ECP), or physical vapor deposition (PVD). A gate made of the metal layer is formed on the substrate by sequential photolithography and etching processes.

A low-k dielectric layer serving as a gate-insulating layer (GIL) is conformally formed on the metal gate prior to formation of a semiconductor layer (not shown) on the gate-insulating layer. Methods of formation of the gate-insulating layer comprise CVD or PECVD. The gate-insulating layer may comprise stacked laminates including $SiO_xN_y$ or $SiN_x$, for example double-layer or sandwiched laminates. The double-layer laminates comprise $GIL/SiN_x$. The sandwiched laminates comprise $GIL/SiO_xN_y/SiN_x$, or $SiO_xN_y/GIL/SiN_x$.

The semiconductor layer comprising a channel layer and an ohmic contact layer is defined on a portion of the gate-insulating layer by deposition and patterning. The channel layer can be an undoped amorphous silicon layer formed by CVD. The ohmic contact layer can be an impurity-added silicon layer formed by CVD.

A metal layer is formed on the ohmic contact layer 150, for example, by CVD, electrochemical plating (ECP), or PVD. The source/drain of metal are formed on the semiconductor layer by selectively etching through the metal layer and ohmic contact layer, exposing a portion of the surface of the channel layer. A pixel electrode is formed, electrically connecting to the source or the drain. As a result, a thin film transistor serving as a switching element is obtained.

In a second embodiment of the invention, by means of CVD or PECVD, a low-k dielectric layer serving as a cap-passivation layer (CPL) is formed on the source and the drain. The cap-passivation layer may comprise stacked laminates including $SiO_xN_y$ or $SiN_x$, for example double-layer or sandwiched laminates. The double-layer laminates comprise $CPL/SiO_xN_y$, $CPL/SiN_x$, $SiN_x/CPL$, $SiO_xN_y/CPL$. The sandwiched laminates comprise $CPL/SiO_xN_y/SiN_x$, $CPL/SiN_x/SiO_xN_y$, $SiO_xN_y/CPL/SiN_x$, $SiO_xN_y/SiN_x/CPL$, $SiN_x/CPL/SiO_xN_y$, or $SiN_x/SiO_xN_y/CPL$.

In the described embodiments, low-k dielectric materials are utilized to replace conventional silicon nitride, and form a low-k dielectric layer serving as a cap-passivation layer on the source/drain, or serving as a gate-insulating layer. As a result, problems such as RC delay are enhanced and no extra processes such as photolithography are required. In other embodiments, low-k dielectric materials are utilized to replace conventional silicon nitride, serving as dielectric layers for a storage capacitor.

Thin film transistors (TFTs) of the invention can be bottom-gate or top-gate, serving as a switching device for a pixel electrode when the source/drain are electrically in contact with a pixel electrode. In addition, the TFTs of the invention can be applied to display such as an LCD.

DESCRIPTION OF THE DRAWINGS

The invention can be more fully understood by reading the subsequent detailed description in conjunction with the examples and references made to the accompanying drawings.

DETAILED DESCRIPTION

First Embodiment

An exemplary process for fabricating a first embodiment of TFTs of the invention is shown in FIGS. 2A-2D.

Figure 1:
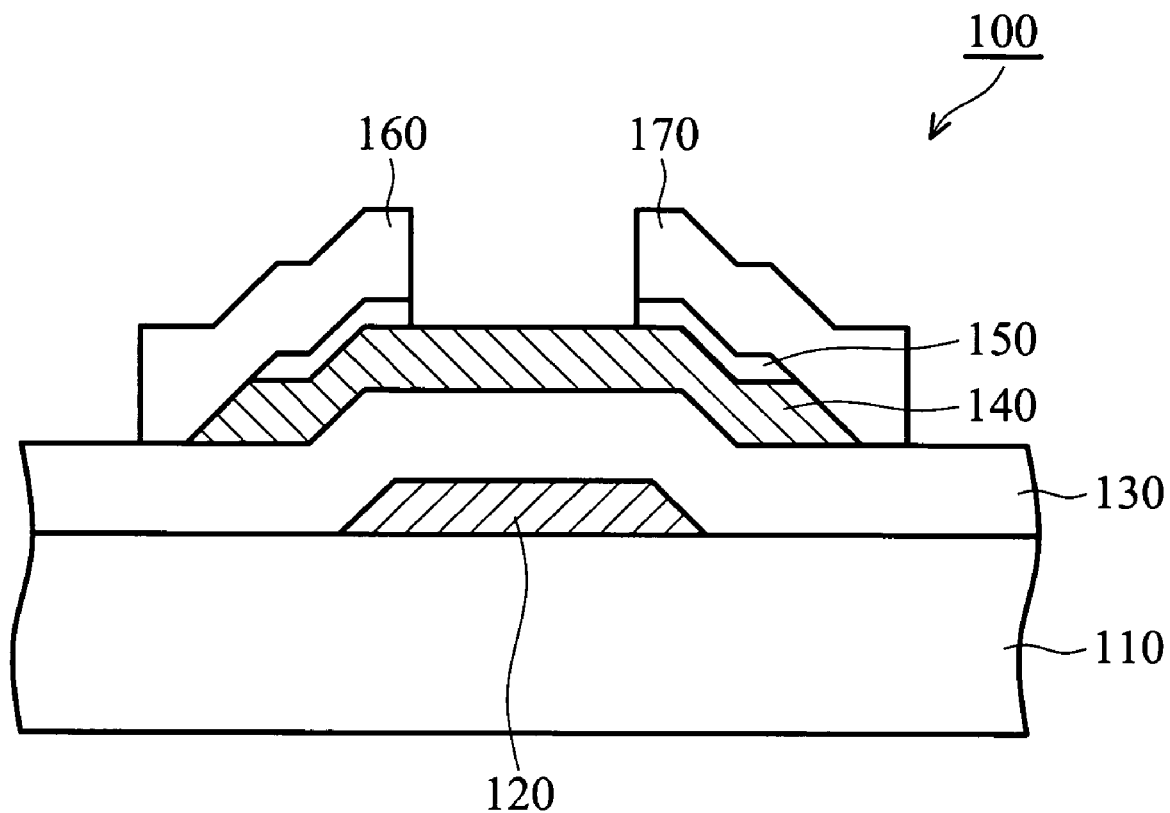
FIG. 1 is a sectional view of a conventional TFT structure.
Figure 2A:
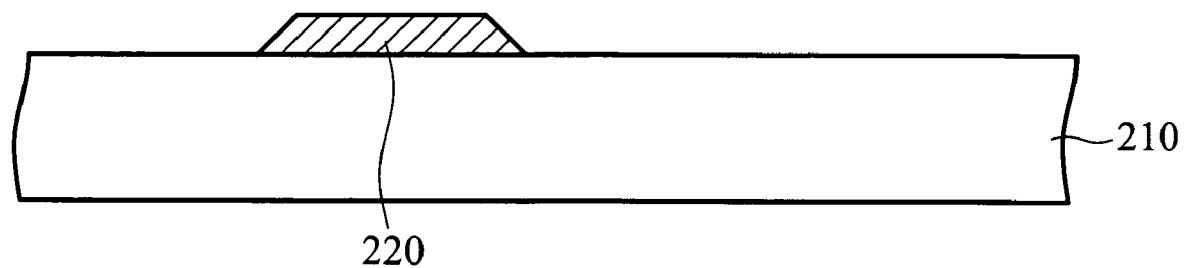
FIGS. 2A to 2D are sectional views of an exemplary process for fabricating a first embodiment of a TFT structure of the present invention.

In FIG. 2A, a metal layer (not shown) is formed on a substrate 210, for example, by chemical vapor deposition (CVD), electrochemical plating (ECP), or physical vapor deposition (PVD). The metal layer is etched, forming a gate 220 on the substrate 210. The substrate 210 may be a glass substrate or a plastic substrate. The gate 220 may be Cu, Al, Ag, or metal alloy thereof, having a thickness substantially between 100 nm and 500 nm.

Figure 2B:
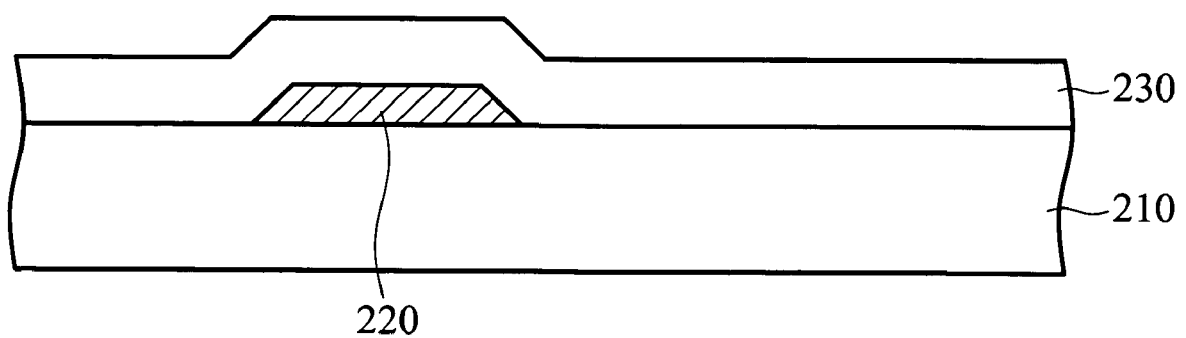

In FIG. 2B, a low-k dielectric layer is conformally formed on the gate 220, serving as a gate-insulating layer 230.

Figure 2C:
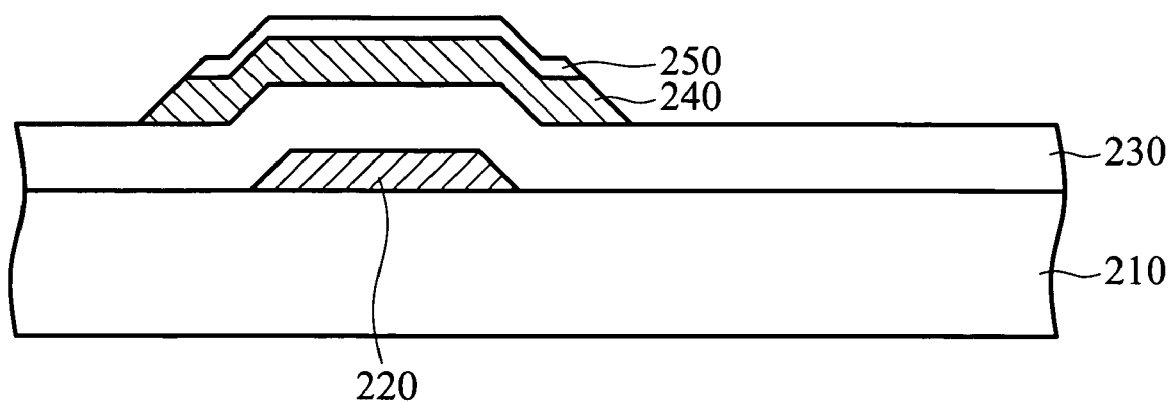

In FIG. 2C, a semiconductor layer (not shown) is formed on the gate-insulating layer 230. The methods of forming the gate-insulating layer 230 comprise CVD or PECVD. The gate-insulating layer 230 comprises a-SiC:H or a-SiCN:H, having a thickness substantially between 50 nm and 500 nm.

The semiconductor layer comprising a channel layer 240 and an ohmic contact layer 250 is defined on a portion of the gate-insulating layer 230 by deposition and patterning. The channel layer 240 can be an undoped amorphous silicon layer formed by CVD, and the thickness thereof is substantially in a range of about 50 nm to about 200 nm. The ohmic contact layer 250 can be an impurity-added silicon layer formed by CVD, and the thickness thereof is substantially in a range of about 10 nm to about 100 nm. The impurity can be n type dopant (for example, P or As) or p type dopant (for example, B).

Figure 2D:
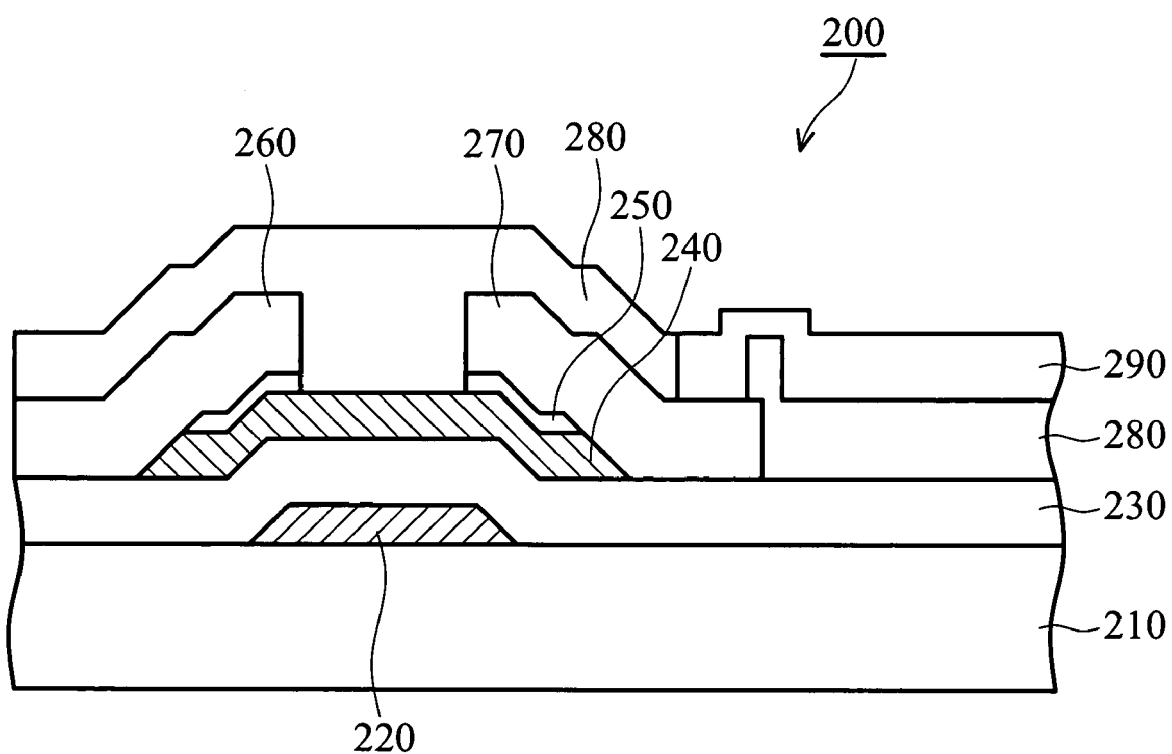

In FIG. 2D, a metal layer (not shown) is formed on the ohmic contact layer 250, for example, by CVD, electrochemical plating (ECP), or PVD. The metal source/drain 260/270 are formed on the semiconductor layer by selectively etching through the metal layer and ohmic contact layer 250, exposing a portion of the surface of the channel layer 240. A passivation layer 280 is subsequently formed on the source/drain 260/270 and the substrate 210. A pixel electrode 290 is formed, electrically connected to the source/drain 260/270. As a result, a thin film transistor 200 serving as a switching element is obtained. The source/drain 260/270 comprise Cu, Ag, Al, or metal alloy thereof. The thickness of the source/drain 260/270 is substantially in a range of about 100 nm to about 500 nm.

The gate-insulating layer (GIL) 230 may comprise stacked laminates including $SiO_xN_y$ or $SiN_x$, for example double-layer or sandwiched laminates. The double-layer laminates comprise GIL/$SiN_x$. The sandwiched laminates comprise GIL/$SiO_xN_y$/$SiN_x$ or $SiO_xN_y$/GIL/$SiN_x$.

Second Embodiment

Figure 3:
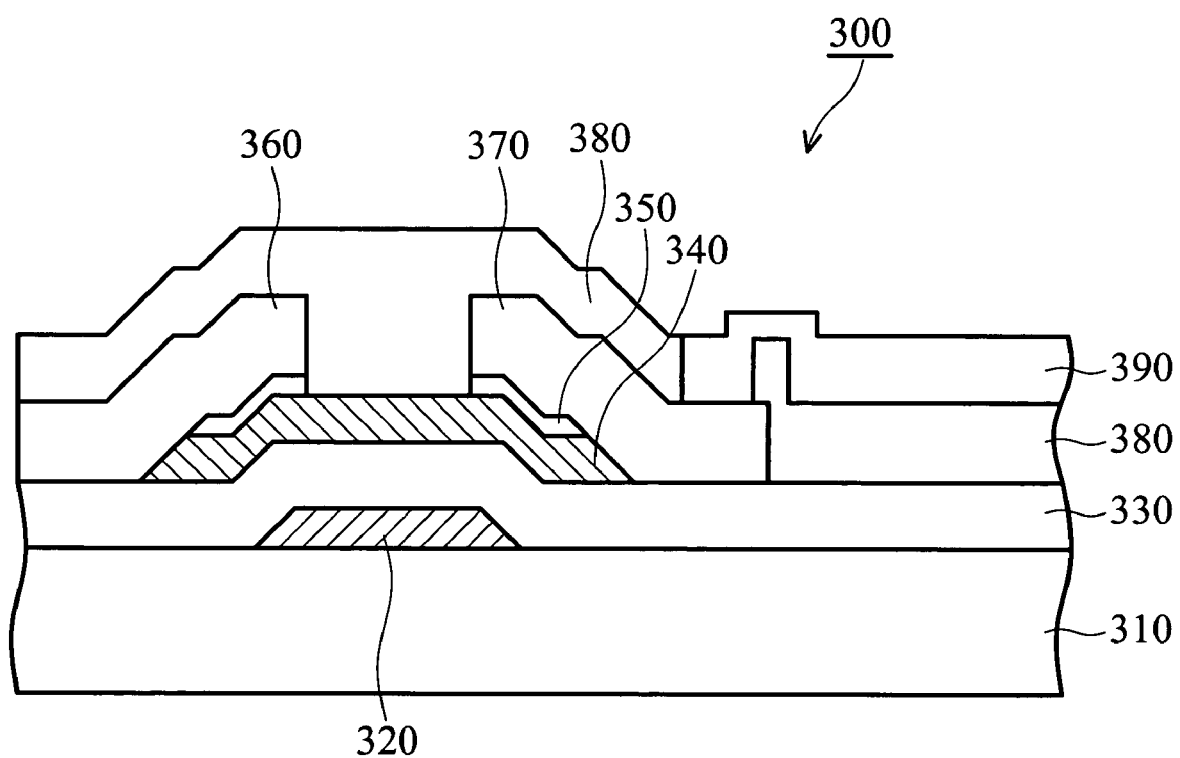
FIG. 3 is a sectional view of an exemplary process for fabricating a second embodiment of a TFT structure of the present invention.

An exemplary process, similar to the first embodiment, for fabricating a second embodiment of TFTs of the present invention is shown in FIG. 3. The exception is that low-k materials are additionally utilized as a cap-passivation layer. The process comprises the following steps.

In FIG. 3, a metal layer (not shown) is formed on a substrate 310, for example, by chemical vapor deposition (CVD), electrochemical plating (ECP), or physical vapor deposition (PVD). The metal layer is etched, forming a gate 320 on the substrate 310. The substrate 310 may be a glass substrate or a plastic substrate. The gate 320 may be Cu, Al, Ag, or metal alloy thereof, having a thickness substantially between 100 nm and 500 nm.

In FIG. 3, a low-k dielectric layer is conformally formed on the gate 320, serving as a gate-insulating layer 330. A semiconductor layer (not shown) is formed on the gate-insulating layer 330. The methods of formation of the gate-insulating layer 330 comprise CVD or PECVD. The gate-insulating layer 330 comprises a-SiC:H or a-SiCN:H, having a thickness substantially between 50 nm and 500 nm.

The semiconductor layer comprising a channel layer 340 and an ohmic contact layer 350 is defined on a portion of the gate-insulating layer 330 by deposition and patterning. The channel layer 340 can be an undoped amorphous silicon layer formed by CVD, and the thickness thereof is substantially in a range of about 50 nm to about 200 nm. The ohmic contact layer 350 can be an impurity-added silicon layer formed by CVD, and the thickness thereof is substantially in a range of about 10 nm to about 100 nm. The impurity can be n type dopant (for example, P or As) or p type dopant (for example, B).

In FIG. 3, a metal layer (not shown) is formed on the ohmic contact layer 350, by CVD, for example, electrochemical plating (ECP), or PVD. The source/drain 360/370 of metal are formed on the semiconductor layer by selectively etching through the metal layer and ohmic contact layer 350, exposing a portion of the surface of the channel layer 340. The source/drain 360/370 comprise Cu, Ag, Al, or metal alloys thereof, having a thickness substantially in a range of about 100 nm to about 500 nm.

In FIG. 3, a cap-passivation layer 380 is subsequently formed on the source/drain 360/370 and the substrate 310. A pixel electrode 390 is formed, electrically connected to the source/drain 360/370. As a result, a thin film transistor 300 serving as a switching element is obtained. The methods of forming the cap-passivation layer 380 comprise CVD or PECVD. The cap-passivation layer 380 comprises a-SiC:H or a-SiCN:H, having a thickness substantially between 100 nm and 400 nm.

The cap-passivation layer 380 may comprise stacked laminates including $SiO_xN_y$ or $SiN_x$, for example double-layer or sandwiched laminates. The double-layer laminates comprise CPL/$SiO_xN_y$, CPL/$SiN_x$, $SiN_x$/CPL, $SiO_xN_y$/CPL. The sandwiched laminates comprise CPL/$SiO_xN_y$/$SiN_x$, CPL/$SiN_x$/$SiO_xN_y$, $SiO_xN_y$/CPL/$SiN_x$, $SiO_xN_y$/$SiN_x$/CPL, $SiN_x$/CPL/$SiO_xN_y$, or $SiN_x$/$SiO_xN_y$/CPL.

In the described first and second embodiments, low-k dielectric materials are utilized to replace conventional silicon nitride, and form a low-k dielectric layer serving as a cap-passivation layer on the source/drain, or serving as a gate-insulating layer. As a result, problems such as RC delay are ameliorated and no additional processes, such as photolithography, are required. In other embodiments, low-k dielectric materials are utilized to replace conventional silicon nitride, serving as dielectric layers for a storage capacitor.

Thin film transistors (TFTs) of the invention can be bottom-gate or top-gate, serving as a switching device for a pixel electrode when the source/drain electrically contacts a pixel electrode. In addition, the TFTs of the invention can be applied to a display such as an LCD.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A switching element for a pixel electrode of a display device, comprising:
   a gate on a substrate;
   a semiconductor layer on the gate;
   a source and a drain on a portion of the semiconductor layer; and
   a low-k dielectric layer disposed between the gate and the semiconductor layer, wherein the low-k dielectric layer consists essentially of a-SiC:H or a-SiCN:H.

2. The switching element of a pixel electrode according to claim 1, further comprising a pixel electrode electrically connected to the source or the drain.

3. The switching element of a pixel electrode according to claim 1, wherein the low-k dielectric layer conformally overlies the gate.

4. The switching element of a pixel electrode according to claim 1, wherein the substrate comprises a glass substrate or a plastic substrate.

5. The switching element of a pixel electrode according to claim 1, wherein the gate comprises Cu, Ag, Al, or metal alloy thereof.

6. The switching element of a pixel electrode according to claim 1, wherein the semiconductor layer comprises silicon.

7. The switching element of a pixel electrode according to claim 1, wherein the source/drain comprises Cu, Ag, Al, or metal alloy thereof.

8. The switching element of a pixel electrode according to claim 1, wherein the low-k dielectric layer comprises a gate insulating layer.

9. The switching element of a pixel electrode according to claim 1, further comprising a cap-passivation layer on the source and the drain, wherein the cap-passivation layer is consisting essentially of a-SiC:H or a-SiCN:H.

10. A method of fabricating a switching element for a pixel electrode of a display device, comprising:
   forming a gate on a substrate;
   forming a low-k dielectric layer on the gate, wherein the low-k dielectric layer consists essentially of a-SiC:H or a-SiCN:H;

forming a semiconductor layer on the low-k dielectric layer and over the gate; and forming a source and a drain on a portion of the semiconductor layer.

11. The method according to claim 10, further comprising a pixel electrode electrically connected to the source or the drain.

12. The method according to claim 10, wherein the low-k dielectric layer conformally overlies the gate.

13. The method according to claim 10, wherein the substrate comprises a glass substrate or a plastic substrate.

14. The method according to claim 10, wherein the gate comprises Cu, Ag, Al, or metal alloy thereof.

15. The method according to claim 10, wherein the semiconductor layer comprises silicon.

16. The method according to claim 10, wherein the source/drain comprises Cu, Ag, Al, or metal alloy thereof.

17. The method according to claim 10, wherein the low-k dielectric layer comprises a gate insulating layer.

18. The method according to claim 10, further comprises forming a cap-passivation layer on the source and the drain, wherein the cap-passivation layer is consisting essentially of a-SiC:H or a-SiCN:H.

* * * * *